United States Patent [19]
Wei et al.

[11] Patent Number: 5,873,760
[45] Date of Patent: Feb. 23, 1999

[54] METHOD OF FORMING AN ELECTROLUMINESCENT ARRAY

[75] Inventors: Cheng-Ping Wei, Gilbert; Cynthia A. Gorsuch; Franky So, both of Tempe, all of Ariz.

[73] Assignee: Motorola, Inc., Schaumburg, Ill.

[21] Appl. No.: 799,317

[22] Filed: Feb. 13, 1997

[51] Int. Cl.[6] .................................................. H05B 37/02
[52] U.S. Cl. ............................................................ 445/24
[58] Field of Search ............................. 445/24; 315/169.3

[56] References Cited

U.S. PATENT DOCUMENTS 5,517,089  5/1996  Ravid ..................................... 315/169.3

*Primary Examiner*—Kenneth J. Ramsey
*Attorney, Agent, or Firm*—Eugene A. Parsons; William E. Koch

[57] ABSTRACT

A method of fabricating an organic electroluminescent array and the array are disclosed. Column buses of indium-tin-oxide (ITO) are formed on a light transparent substrate and a resistor network is simultaneously formed of the ITO. An array of organic electroluminescent devices is formed on the column buses with each column bus connected to a terminal of each device in an associated column of devices. Row buses are formed on the organic electroluminescent devices with each row bus connected to a second terminal of each device in an associated row of devices and, simultaneously, the resistor network is connected to the row buses. The resistor network is part of a "pull up" circuit integrally formed with the organic electroluminescent devices to dynamically reverse bias the devices and neutralize forward bias voltage of a scan of the devices.

11 Claims, 2 Drawing Sheets

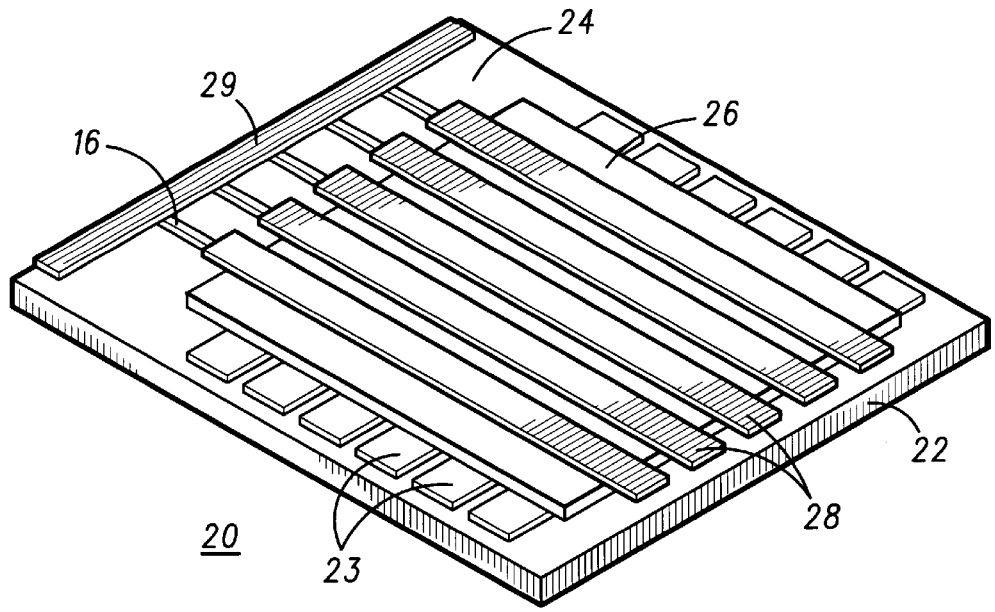
FIG. 4
FIG. 5
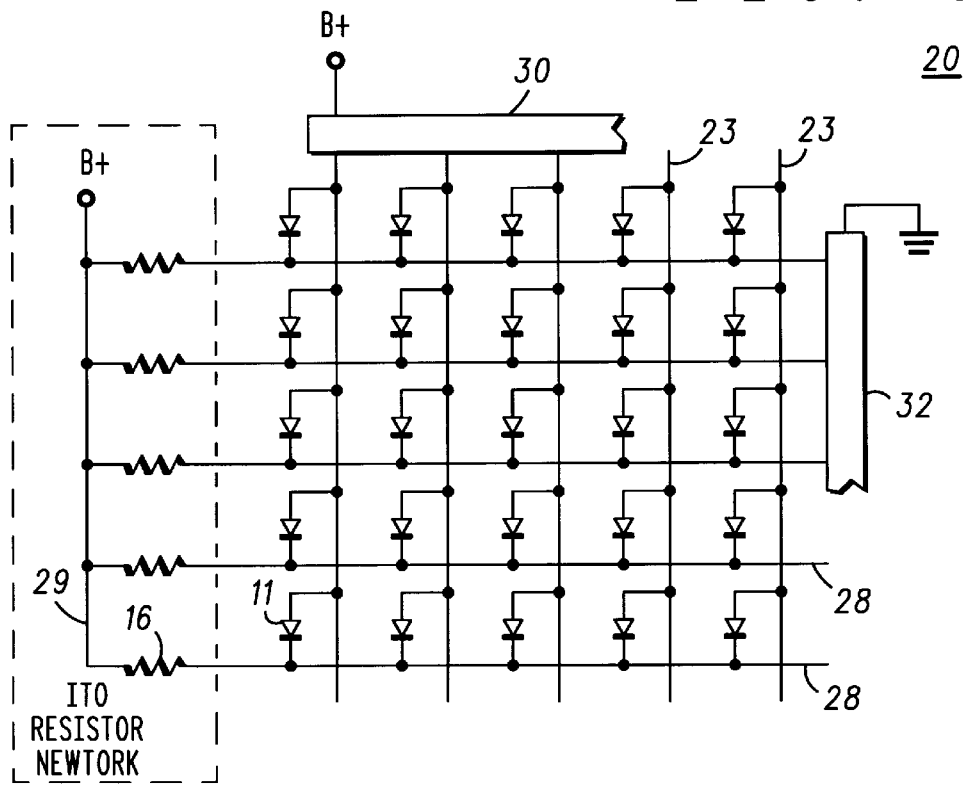

METHOD OF FORMING AN ELECTROLUMINESCENT ARRAY

FIELD OF THE INVENTION

The present invention relates, in general, to display devices, and more particularly, to eliminating shadows on images on a display.

BACKGROUND OF THE INVENTION

Arrays of light emitting devices, such as inorganic light emitting diodes, organic light emitting diodes or electroluminescent devices, etc., are becoming increasingly popular in displays. This popularity is chiefly due to the low operating voltages and power required and to the small size, as well as the ease of manufacturing. This is especially true of organic electroluminescent devices (OEDs), since manufacturing is even easier than many other light emitting devices, the brightness is even greater, and the voltage requirements are substantially less.

Also, organic electroluminescent device (OED) arrays are emerging as a potentially viable design choice for use in small products, especially small portable electronic devices, such as pagers, cellular and portable telephones, two-way radios, data banks, etc. OED arrays are capable of generating sufficient light for use in displays under a variety of ambient light conditions (from little or no ambient light to bright ambient light). Further, OEDs can be fabricated relatively cheaply and in a variety of sizes from very small (less than a tenth millimeter in diameter) to relatively large (greater than an inch) so that OED arrays can be fabricated in a variety of sizes. Also, OEDs have the added advantage that their emissive operation provides a very wide viewing angle.

Generally, OEDs include a first electrically conductive layer (or first contact), an electron transporting and emission layer, a hole transporting layer and a second electrically conductive layer (or second contact). The light can be transmitted either way but must exit through one of the conductive layers. There are many ways to modify one of the conductive layers for the emission of light therethrough but it has been found generally that the most efficient OED includes one conductive layer which is transparent to the light being emitted. Also, one of the most widely used conductive, transparent materials is indium-tin-oxide (ITO), which is generally deposited in a layer on a transparent substrate such as a glass plate.

The problem is that most of the light emitting devices have an internal capacitance which charges during operation and remains charged after activation of the device. This lingering or persisting charge produces what is commonly referred to as shadows in the display, because the charge remaining from a previous row of data will continue to produce light emissions that appear in the next row of data and, in some circuits, may effect the next row of data. Because OEDs include a layer of organic material, which is nearly a dielectric, sandwiched between layers of conducting material, the internal capacitance is relatively large. Thus the shadow problem is especially prevalent in arrays of OEDs.

Accordingly, it would be highly desirable to produce an array of light emitting diodes in which no shadow is prevalent.

It is a purpose of the present invention to provide a new and improved array of light emitting devices with active pull down shadow canceling.

It is another purpose of the present invention to provide a new and improved array of light emitting devices with active pull down shadow canceling which adds very little complexity to the array.

It is still another purpose of the present invention to provide a new and improved array of light emitting devices with active pull down shadow canceling which is relatively simple and inexpensive to manufacture.

It is a still further purpose of the present invention to provide a new and improved array of light emitting devices with active pull down shadow canceling which is easily integrated on a common substrate with little additional cost and effort.

It is also an object of the present invention to provide new and improved means for scanning an organic electroluminescent array display.

It is a further object of the present invention to provide organic electroluminescent displays which are less expensive, smaller, and easier to manufacture.

It is still yet another object of the present invention to provide electroluminescent displays with reduced shadow effects in image generation.

SUMMARY OF THE INVENTION

The above problems and others are at least partially solved and the above objects and others are realized in a method of fabricating an organic electroluminescent array including the steps of forming a plurality of column buses of light transparent electrically conductive material on a light transparent substrate and simultaneously forming a resistor network of the light transparent material. A plurality of organic electroluminescent devices is arranged in rows and columns of pixels in overlying relationship to the column buses, one each of the column buses being associated with one each column of organic electroluminescent devices, and each column bus is connected to a first terminal of each organic electroluminescent device in the associated column of organic electroluminescent devices. A plurality of row buses is formed on the organic electroluminescent devices, one each of the row buses being associated with one each row of organic electroluminescent devices, and each row bus is connected to a second terminal of each organic electroluminescent device in the associated row of organic electroluminescent devices. The resistor network is connected to the plurality of row buses and to a power bus.

The resistor network is included in a "pull up" circuit which, in conjunction with scanning circuitry, reduces or eliminates shadows caused by charge retention in the natural capacitance of organic electroluminescent devices. After each row of organic electroluminescent devices is scanned a reverse charge is applied to the internal capacitance of the devices through the attached resistor network, which rapidly discharges the internal capacitance.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIG. 4 is a simplified isometric view of an organic electroluminescent device array in accordance with the present invention; and FIG. 5 is a schematic diagram of the organic electroluminescent device array of FIG. 4.

DESCRIPTION OF THE PREFERRED EMBODIMENT

Figure 1:
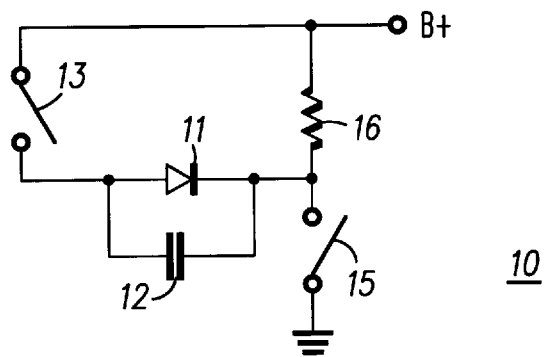
FIG. 1 is a schematic diagram of an addressed organic electroluminescent device including a pull-up circuit.

Turning now to the drawings in which like reference characters indicate corresponding elements throughout the several views, attention is first directed to FIG. 1 which is a simplified schematic diagram of a single addressed light emitting device in an address circuit 10, utilized for the purpose of explaining the shadow effect. Circuit 10 illustrates an organic electroluminescent device (OED) 11 including an inter-electrode capacitance 12 which is illustrated in parallel therewith. The anode of OED 11 is connected through a column driver, represented in FIG. 1 by a switch 13, to a source of power designated B+. The cathode of OED 11 is connected through a row driver, represented in FIG. 1 by a switch 15, to a common potential, in this example ground. The cathode of OED 11 is also connected to one end of a pull-up resistor 16, the other end of which is connected to B+. It will be understood from the following explanation that pull-up resistor 16 can be connected to a common source of potential with switch 13 or to a different source of potential and to a different potential.

When OED 11 is addressed, switches 13 and 15 are closed, which represents a specific column and row being addressed and which in turn addresses a specific OED in an array or matrix of OEDs. With switches 13 and 15 closed, the potential from B+ to ground is applied directly across OED 11 and parallel inter-electrode capacitance 12. Because inter-electrode capacitance 12 appears initially as a short circuit, current flows into the capacitance very rapidly. As the inter-electrode capacitance becomes charged current flows through OED 11 generating light.

Figure 2:
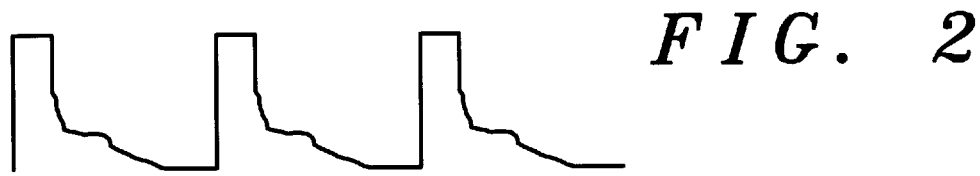
FIG. 2 illustrates a waveform of voltage versus time of scanning of a row of organic electroluminescent devices without pull-up.

Turning now to FIG. 2, a voltage versus row strobe pulse waveform is illustrated. In this waveform a circuit similar to that of FIG. 1 is assumed, without resistor 16 in the circuit. On the initial strobe (closing of switches 13 and 15) the voltage across OED 11 and interelectrode capacitance 12 rises very rapidly and remains high until one or both of switches 13 and 15 are opened. When this occurs, the voltage drops sharply until the charge which has accumulated in inter-electrode capacitance 12 becomes dominant. At this point inter-electrode capacitance 12 slowly discharges through OED 11 (the only remaining discharge path). This slow discharge through OED 11 not only causes OED 11 to continue to emit (generally at a lower level) but can also interfere to a minor extent with adjacent OEDs in the array. This continued emission and interaction with other OEDs is commonly referred to as a shadow effect, since it is not as bright as the initial image and may appear as a shadow in the desired image.

Figure 3:
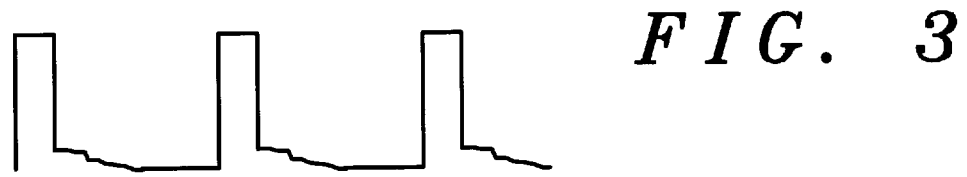
FIG. 3 illustrates a waveform of voltage versus time of scanning of a row of an organic electroluminescent display with pull-up, as illustrated in FIG. 1.

To solve this shadow problem the circuit of FIG. 1 has been devised. Assuming now that pull-up resistor 16 is connected in the circuit as illustrated in FIG. 1 and the charging operation is the same, when switches 13 and 15 are opened the voltage across OED 11 drops rapidly similar to the above explanation. However, instead of inter-electrode capacitance 12 discharging through OED 11 as before, the positive potential B+ is applied through pull-up resistor 16 directly to the negatively charged side of inter-electrode capacitance 12. This reverse potential or bias may be referred to as a pull-up potential or bias. Thus, inter-electrode capacitance 12 is quickly discharged, as illustrated in the waveform of FIG. 3, and the shadow effect is virtually completely removed or eliminated.

Turning now to FIG. 4, an isometric view of an organic electroluminescent device (OED) array 20 in accordance with the present invention is illustrated. While it will be understood that array 20 may include virtually any light emitting devices which include internal capacitance and, therefore, have a shadow problem, in this specific example the light emitting devices are described as organic electroluminescent devices (OEDs) because the shadow problem is especially prevalent in this type of device.

OED array 20 is formed on a light transparent substrate 22, which is formed for example of glass, hard plastic, etc. Array 20 includes a plurality of transparent column buses 23 formed directly on substrate 22. Column buses 23 are formed of a light transparent electrically conductive material, such as indium-tin-oxide and extend in parallel, spaced apart relationship across substrate 22. Generally, column buses 23 are formed by depositing a blanket layer of the light transparent electrically conductive material on the upper surface of substrate 22 and patterning the layer, utilizing conventional mask and etch techniques, to define column buses 23. As will be understood presently, column buses 23 are formed with a flat upper surface and a width commensurate with a desired width of OEDs to be formed thereon. OEDs can be fabricated in a variety of sizes from very small (less than a tenth millimeter in diameter) to relatively large (greater than an inch) so that OED array 10 can be fabricated in a variety of sizes.

In the same operation in which column buses 23 are formed, a plurality of pull-up resistors 24 are formed along one side, or on a free space, on substrate 22. Pull-up resistors 22 are preferably formed perpendicular to column buses 23 and generally in alignment with one end of each row of array 20. Pull-up resistors 24 are patterned during the patterning of column buses 23, utilizing the same conventional mask and etch techniques, and are formed of the same light transparent, electrically conductive material. In the preferred embodiment the light transparent, electrically conductive material is indium-tin-oxide (ITO) which, for example, has a resistivity of approximately 50 ohms/square (75 to several hundred ohms/square). Thus, very reliable and consistent pull-up resistors can be integrated onto substrate 22 along with OED array 20, without adding any additional steps or any additional connections.

An organic electroluminescent sandwich 26 is then deposited over column buses 23. Here it should be noted that column buses 23 form the anode electrodes of each OED in this specific embodiment. Generally an OED includes a thin layer of a low work function metal (e.g. lithium or an alloy thereof), a first electron transporting layer, a light emission layer, and a hole transporting layer. It will of course be understood that in specific OEDs some of these layers may be eliminated and/or the functions combined in other of the layers.

A plurality of parallel metal row buses 28 is then formed over the organic electroluminescent sandwich 26 and perpendicular to column buses 23, generally by depositing a blanket layer of metal and patterning the layer of metal into row buses 28 using conventional mask and etch techniques. Row buses 28 operate as a cathode for each organic electroluminescent device in array 20. During the patterning operation, one end of each row bus 28 is formed to contact one end of an associated pull-up resistor 16 which is, preferably, positioned parallel therewith and adjacent the one end. Thus, each row bus 28 has one end of an associated pull-up resistor 16 connected thereto automatically during fabrication. Also, a potential bus 29 is defined from the layer of metal during the patterning process. Potential bus 29 is formed adjacent an edge of substrate 22 and in contact with a second end of each of pull-up resistors 16.

In a slightly different process of fabrication, after the formation of column buses 23 and pull-up resistors 16, a layer of dielectric material (e.g. an oxide or a nitride) is deposited thereover. Channels are formed in the dielectric layer deep enough to expose portions of the upper surfaces of column buses 23. In a preferred embodiment the channels are oriented perpendicular to column buses 23 and are aligned with pull-up resistors 16. Organic electroluminescent sandwich 26 is then deposited in the channels and metal row buses 28 are formed directly on the channels for OED cathode contacts and for sealing of the organic materials, generally as described above. Organic electroluminescent sandwich 26 is formed by depositing blanket layers and masking and etching or, selective depositions, or by any other convenient steps.

When drive voltages are applied across a selected column bus 23 (the anode) and a selected row bus 28 (the cathode), current will flow through the portion of the organic electroluminescent sandwich 26 located at the intersection thereof, which is defined as a pixel, and only that portion will luminesce. Turning now to FIG. 5, organic electroluminescent array 20 is illustrated schematically with each pixel represented as a diode 11 with an anode connected to a column bus 23 and a cathode connected to a row bus 28. Further, each pull-up resistor is illustrated with one end connected to an associated row bus 28 and the other end connected in common to potential bus 29.

To place organic electroluminescent array 20 in operation a column driver 30 is connected to one end of each column bus 23 and a row driver 32 is connected to each row bus 28 in any well known manner. Further, a pull-up potential (in this example B+) is connected to potential bus 29. Thus, each time a specific column driver 30 and row driver 32 are addressed a circuit similar to that shown in FIG. 1 is formed.

Generally, a shift register or similar switching circuit is provided to cycle through row drivers 32. The shift register advances a pulse therein in response to each timing signal received from a timing control to successively energize its outputs to activate the respective row drivers 28 to apply a common potential onto each of the metal cathode buses 28, in turn, during a frame time period. A one line memory, or similar type of memory, having a storage element therein for each ITO anode bus 23 provides outputs for controlling the respective column drivers. A column of data in an output register or similar memory is transferred in parallel into the one line memory. In response to each timing or enabling signal received from a timing control, each storage element of the one line memory stored as a binary "1" digit serves to simultaneously activate a respective column driver to apply a drive voltage on an associated ITO anode bus 23.

In forming the images of a frame during a scan of OED array 20, there is high inter-electrode capacitance at the junction of an ITO anode bus 23 and a metal cathode bus 28. When driving the OED array 20, pull-up resistors 16 automatically apply a pull-up bias voltage to each diode 16 which cancels the shadow effect. Pull-up resistors are integrated into OED array 20 at virtually no extra cost, since very little effort is required to change the ITO and metal mask designs to include the shadow canceling pull up resistor network. This integrated resistor network formed by ITO resistors 16 saves significant space on the system PC board and reduces direct material cost.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating an organic electroluminescent array comprising the steps of:

providing a substrate of light transparent material;

forming a plurality of column buses of light transparent electrically conductive material on the substrate and simultaneously forming a resistor network of the light transparent material;

forming a plurality of organic electroluminescent devices arranged in rows and columns of pixels in overlying relationship to the column buses, one each of the column buses being associated with one each column of organic electroluminescent devices, connecting each column bus to a first terminal of each organic electroluminescent device in the associated column of organic electroluminescent devices;

forming a plurality of row buses on the organic electroluminescent devices, one each of the row buses being associated with one each row of organic electroluminescent devices, connecting each row bus to a second terminal of each organic electroluminescent device in the associated row of organic electroluminescent devices; and connecting the resistor network to the plurality of row buses.

2. A method of fabricating an organic electroluminescent array as claimed in claim 1 wherein the step of forming the plurality of column buses and the resistor network of light transparent electrically conductive material includes depositing a layer of the light transparent material on the substrate and patterning the layer of light transparent material to define the column buses and the resistor network.

3. A method of fabricating an organic electroluminescent array as claimed in claim 2 wherein the step of depositing the layer of the light transparent material on the substrate includes depositing a layer of indium-tin-oxide.

4. A method of fabricating an organic electroluminescent array as claimed in claim 2 wherein the step of forming the plurality of organic electroluminescent devices arranged in rows and columns of pixels includes depositing a layer of insulating material and patterning the layer of insulating material to define trenches at least partially overlying the column buses so as to expose portions of the column buses in the trenches, and depositing organic electroluminescent material in the trenches to form the organic electroluminescent devices.

5. A method of fabricating an organic electroluminescent array as claimed in claim 4 wherein the steps of forming the plurality of row buses and connecting the resistor network to the plurality of row buses includes depositing a layer of metal on the layer of insulating material and the trenches of organic electroluminescent material and patterning the layer of metal to define the plurality of row buses.

6. A method of fabricating an organic electroluminescent array as claimed in claim 5 wherein the step of patterning the layer of metal includes patterning the layer of metal to define a common power bus connected to the resistor network.

7. A method of fabricating an organic electroluminescent array comprising the steps of:

provide a substrate of light transparent material;

depositing a layer of light transparent, electrically conductive material on the substrate;

patterning the layer of material to define a plurality of column buses of the material on the substrate and simultaneously forming a resistor network of the light transparent material including a plurality of resistors each with first and second terminals;

depositing organic electroluminescent material on the substrate and patterned layer of material to form a plurality of organic electroluminescent devices arranged in rows and columns of pixels in overlying relationship to the column buses, one each of the column buses being associated with one each column of organic electroluminescent devices, each column bus being connected to a first terminal of each organic electroluminescent device in the associated column of organic electroluminescent devices;

depositing a layer of metal on the organic electroluminescent material and patterning the layer of metal to define a plurality of row buses, one each of the row buses being associated with one each row of organic electroluminescent devices, and each row bus being connected to a second terminal of each organic electroluminescent device in the associated row of organic electroluminescent devices;

patterning the layer of metal to connect one each of the first terminals of the plurality of resistors in the resistor network to one each of the plurality of row buses; and patterning the layer of metal to connect the second terminals of each of the plurality of resistors in the resistor network to a common power bus.

8. A method of fabricating an organic electroluminescent array as claimed in claim 7 wherein the step of depositing the layer of the light transparent material on the substrate includes depositing a layer of indium-tin-oxide.

9. A method of fabricating an organic electroluminescent array comprising the steps of:

providing a substrate of light transparent material;

depositing a layer of light transparent, electrically conductive material on the substrate;

patterning the layer of material to define a plurality of column buses of the material on the substrate and simultaneously forming a resistor network of the light transparent material including a plurality of resistors each with first and second terminals;

depositing a layer of insulating material on the substrate and the patterned layer of material and patterning the layer of insulating material to define trenches at least partially overlying the column buses so as to expose portions of the column buses in the trenches;

depositing organic electroluminescent material in the trenches and in contact with the exposed portions of the column buses to form a plurality of organic electroluminescent devices arranged in rows and columns of pixels in overlying relationship to the column buses, one each of the column buses being associated with one each column of organic electroluminescent devices, each column bus being connected to a first terminal of each organic electroluminescent device in the associated column of organic electroluminescent devices;

depositing a layer of metal on the layer of insulating material and the trenches of organic electroluminescent material and patterning the layer of metal to define a plurality of row buses, one each of the row buses being associated with one each row of organic electroluminescent devices, and each row bus being connected to a second terminal of each organic electroluminescent device in the associated row of organic electroluminescent devices;

patterning the layer of metal to connect one each of the first terminals of the plurality of resistors in the resistor network to one each of the plurality of row buses; and patterning the layer of metal to connect the second terminals of each of the plurality of resistors in the resistor network to a common power bus.

10. A method of fabricating an organic electroluminescent array as claimed in claim 9 wherein the step of patterning the layer of insulating material to define trenches includes defining the trenches in overlying relationship to the plurality of resistors in the resistor network so as to expose the first and second terminals.

11. A method of fabricating an organic electroluminescent array as claimed in claim 9 wherein the step of depositing the layer of the light transparent material on the substrate includes depositing a layer of indium-tin-oxide.

* * * * *